United States Patent [19]
Nuyen

[11] Patent Number: 5,593,917
[45] Date of Patent: Jan. 14, 1997

[54] METHOD OF MAKING SEMICONDUCTOR COMPONENTS WITH ELECTROCHEMICAL RECOVERY OF THE SUBSTRATE

[75] Inventor: Linh T. Nuyen, Paris, France

[73] Assignee: Picogiga Societe Anonyme, Les Ulis, France

[21] Appl. No.: 275,445

[22] Filed: Jun. 6, 1994

Related U.S. Application Data

[63] Continuation-in-part of PCT/FR92/01154, Dec. 4, 1992.

[30] Foreign Application Priority Data

Dec. 6, 1991 [FR] France .................... 91 15139

[51] Int. Cl.$^6$ ............... H01L 21/20; H01L 21/14; H01L 21/306; H01L 21/465
[52] U.S. Cl. ............... 437/86; 437/132; 437/133; 437/170; 437/974
[58] Field of Search ............... 148/DIG. 135; 437/86, 132, 133, 170, 974, 62

[56] References Cited

U.S. PATENT DOCUMENTS

| | | | |
|---|---|---|---|
| 3,508,980 | 4/1970 | Jackson et al. | 437/86 |
| 3,655,540 | 4/1972 | Irvin | 148/DIG. 135 |
| 4,321,613 | 3/1982 | Hughes et al. | 437/133 |
| 4,369,099 | 1/1983 | Kohl et al. | 204/129.3 |
| 4,700,467 | 10/1987 | Donzelli | 148/DIG. 135 |
| 4,818,724 | 4/1989 | Cetronio et al. | 437/203 |
| 5,202,018 | 4/1993 | Horanyl et al. | 204/129.2 |

FOREIGN PATENT DOCUMENTS

| | | |
|---|---|---|
| 0029334 | 5/1981 | European Pat. Off. . |
| 0417851 | 3/1991 | European Pat. Off. . |
| 2639149 | 5/1990 | France . |

OTHER PUBLICATIONS

M. Konagai et al., "High efficiency GaAs thin film solar cells by peeled film technology", Journal of Crystal Growth, vol. 45, 1978, pp. 277–280.

E. Yablonovitch et al., "Extreme selectivity in the lift–off of epitaxial GaAs films", Applied Physics Letters, vol. 51, No. 26, Dec. 28, 1987, pp. 2222–2224.

*Primary Examiner*—Mary Wilczewski
*Assistant Examiner*—Brian K. Dutton
*Attorney, Agent, or Firm*—Jacobson, Price, Holman & Stern, PLLC

[57] ABSTRACT

The method is characterized by the steps consisting in: a) producing a semi-insulating or n-type substrate; b) forming a separating layer of a $p^+$-type doped material on the surface of said substrate; c) forming an active layer on said separating layer, the active layer including at least a bottom layer with n-type doping; d) making a set of semiconductor components by etching and metalizing said active layer; g) fixing a common support plate on the assembly made in this way, thereby holding the components together mechanically; and h) dissolving the material of the separating layer anodically and without illumination while leaving the other materials intact, thereby separating the substrate from said components without dissolving the substrate.

7 Claims, 2 Drawing Sheets

METHOD OF MAKING SEMICONDUCTOR COMPONENTS WITH ELECTROCHEMICAL RECOVERY OF THE SUBSTRATE

This is a continuation-in-part of application Ser. No. PCT/FR92/01154, filed on Dec. 4, 1992.

The invention relates to a method of making semiconductor electronic components.

BACKGROUND OF THE INVENTION

As explained below, the invention is applicable to a wide variety of components, including not only those which are made of substrates of group IV materials (essentially silicon), but also those made on the basis of III–V (GaAs, InP, etc.) materials or on the basis of II–VI materials.

The method provides for detaching and recovering the substrate on which the components are made.

Proposals have already been made to make electronic components and then separate them from their substrates. That technique has already been proposed, in particular for Schottky diodes or for MESFETs on a GaAs or an InP substrate, with separation being obtained by chemically dissolving a layer of $Al_xGa_{1-x}As$ having a high aluminum content (molar fraction $x_{Al}$<0.50) previously grown epitaxially between the substrate and the active layers of semiconductor material constituting the electronic components proper. In this respect, reference may be made to M. Konagai et al., *High efficiency GaAs thin film solar cells by peeled film technology*, Journal of Crystal Growth, No. 45 (1978), p. 277, E. Yablonovitch et al., *Extreme selectivity in the lift-off of epitaxial GaAs films*, Appl. Phys. Lett., Vol. 51, no. 26, 28 Dec. 1987, p. 222, or H. Schumacher et al., *High speed InP/GaInAs photodiode on sapphire substrate*, Electronics Letters, Vol. 25, No. 24, 23 Nov. 1989, p. 1653.

Nevertheless, that technique is limited to the special cases of components on a substrate of GaAs or of InP, and because of the special characteristics of the soluble separating layer, it cannot be transposed directly to components other than Schottky diodes or MESFETs on GaAs or InP substrates.

OBJECTS AND SUMMARY OF THE INVENTION

One of the objects of the present invention is to provide a method of making semiconductor components that is applicable to a very wide variety of components (field effect transistors, bipolar transistors, controlled rectifiers, etc.) and to a very large number of materials (components on silicon, on GaAs, on II–VI materials, etc.).

The ability to separate components from the substrate on which they are made presents many advantages.

Firstly, that technique makes it possible to reduce the thickness of the components by completely eliminating the substrate, together with all of the associated advantages that stem therefrom: with the substrate eliminated, there is no longer any need to make vias through the substrate to make electrical contact with the bottom layer of the component; the cost of manufacturing the component is correspondingly reduced; the weight of the component is considerably reduced which is an advantage in space applications; in certain optoelectronic applications, the substrate may constitute a drawback since it is not transparent to the wavelengths in question; and finally, heat dissipation is considerably improved by eliminating the thermal resistance constituted in present-day components by the presence of a substrate (in particular if it is made of GaAs or InP since they are poor conductors of heat).

Secondly, and above all, the method of the invention makes it possible to recover the material of the substrate without destroying it, thereby saving not only the cost of the lapping step, but also the cost of the substrate which can be reused directly. This advantage is even greater when the substrate is made of a material that is expensive.

It will also be seen that the method of the invention can be implemented accurately, in a manner that is easily controlled and suitable for industrialization, thus making low cost mass production possible.

To this end, the method of the invention is characterized by the steps consisting in: producing a semi-insulating or n-type substrate; forming a separating layer of a $p^+$-type doped material on the surface of said substrate; forming an active layer on said separating layer, the active layer including at least a bottom layer with n-type doping; making a set of semiconductor components by etching and metalizing said active layer; fixing a common support plate on the assembly made in this way, thereby holding the components together mechanically; and dissolving the material of the separating layer anodically and without illumination while leaving the other materials intact, thereby separating the substrate from said components without dissolving the substrate.

When the active layer also includes at least one p-doped layer, provision is also made for steps consisting in: covering the set of components with a protective layer of a passivation material or of a photosensitive resin; and selectively etching said protective layer so as to bare the separating layer between said components or between groups of said components.

It is also possible to provide for a final step consisting in depositing metallization on the rear face of the active layer of the components or groups of components as uncovered by removing the substrate, and/or in separating the various individual components or groups of components from the common support plate; in either case, provision may be made for fixing the various individual components or groups of components on a common support member via the rear face. If necessary, the common support plate and/or, where applicable, the common support member, may carry component interconnection lines and/or, they may possibly be transparent when the components are optoelectronic components.

BRIEF DESCRIPTION OF THE DRAWINGS

There follows a description of an implementation of the invention with reference to the accompanying drawings, in which.

The component described in the figures is naturally given solely by way of example, and could equally well be of some other type or some other configuration.

MORE DETAILED DESCRIPTION

Figure 1:
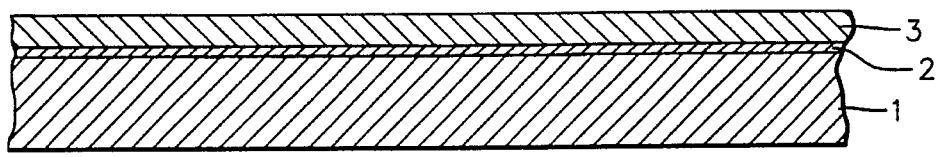
FIGS. 1 to 9 are diagrams showing the various steps in making a component using the method of the invention.

FIG. 1 shows the layers of the starting wafer comprising a substrate 1 that is thick (typically about 500 micrometers thick) made of silicon, GaAs, InP, etc., on which a very thin (e.g. about a few hundreds of nanometers thick) $p^+$-doped separating layer 2 is grown epitaxially. Thereafter, an active layer 3 is formed on said separating layer 2, with the doping, the thickness, and the structure of the active layer 3 being selected as a function of the component to be made.

The separating layer 2 may also be obtained by being implanted through the layer 3.

The active layer 3 may be constituted by a stack of successive layers each of different composition, doping, and thickness, so the term "active layer" is used herein to designate such a stack collectively.

The active layer includes at least a bottom layer that is of n-type, i.e. it may be constituted solely by such an n-type layer (e.g. if the component is a field effect transistor, then its source, grid, and drain electrodes are all three deposited directly on the single n-type layer), or else it may comprise a plurality of n-type and p-type layers, constituting a structure that is more complex (such a multiple active layer may constitute an n-p-type structure for a bipolar transistor). As explained below, if the active layer includes one or more p-type layers, then special precautions need to be taken.

Figure 2:
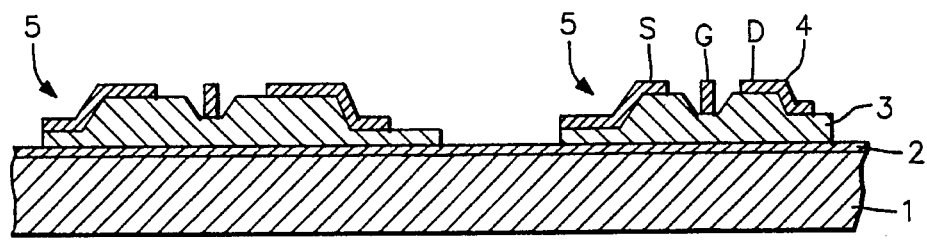

At the step of FIG. 2, various known methods steps of chemical, ion-beam or reactive ion-beam etching steps have been performed on the active layer 3, metallization 4 has been deposited, etc., so as to constitute various individual components 5 with their source, grid, and drain electrodes S, G, and D respectively (where the component is a field effect transistor), or emitter, base, and collector electrodes (where the component is a bipolar transistor), or anode, cathode, and trigger electrodes (where the component is a controlled rectifier), etc.

It will be observed that it is equally possible to make isolated components (individual transistors) or to make groups of components, which may correspond to a given logic or analog function, the various elementary components of such groups of components then being made on the same region of the active layer 3 and being interconnected by appropriate metallization.

Figure 3:
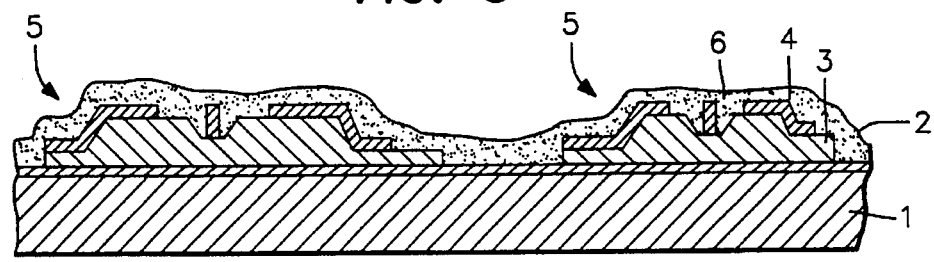
Figure 4:
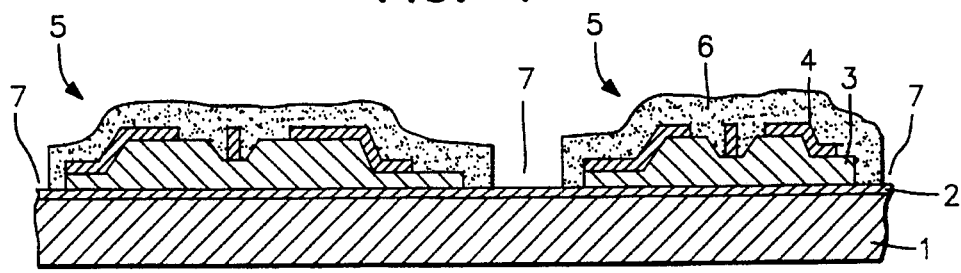

The steps of FIGS. 3 and 4 which are now described relate solely to the case explained above where the active layer includes one or more p-doped layers. If the active layer includes n-doped materials only, then it is possible to pass directly to the step shown in FIG. 5.

Thus, in the step of FIG. 3, the set of components has been coated in a protective layer 6 of inert material which may be constituted, in particular, by a photosensitive resin or by a passivation layer for the component (an oxide or nitride layer), deposited in conventional manner.

In the step of FIG. 4, the protective layer 6 has been etched in such a manner as to bare the p+-doped separating layer 2 in regions marked 7, while protecting the flanks of the components or groups of components (and in particular the p-doped layers of the active layer) which are then in the form of mutually isolated islands on the substrate. These openings 7 are made by conventional techniques of photolithography or of electron lithography, when the layer is constituted by a photosensitive resin, or by conventional etching techniques when the layer is a passivation layer.

Figure 5:
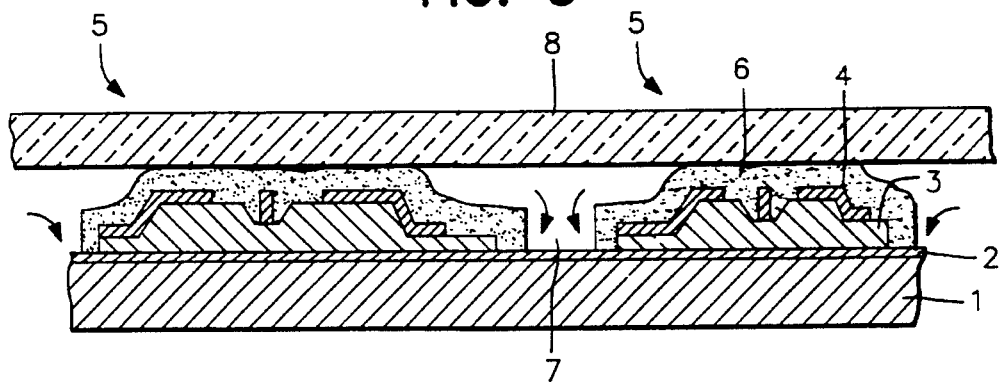

In the step of FIG. 5, the set of components is covered by a common plate 8, e.g. glued to the protective layer 6 after it has been deposited.

The next step of the treatment, after the plate 8 has been glued in place, consists in dissolving the $p^+$-doped separating layer 2 electrochemically (anodic dissolution), with the semiconductor material of said layer put into contact with an electrolyte (e.g. KOH) constituting an anode relative to a reference electrode. By the "soluble anode" phenomenon, said electrode is caused to disappear progressively, i.e. the material of the separating layer, and of that layer only, is progressively eliminated. The electrolyte penetrates via the interstices formed between the components and etches said layer at the regions 7 that have been bared, after which it etches it edgewise as represented by the arrows in FIG. 5. The remaining parts of the structure, and in particular the substrate, the regions protected by the inert layer 6, the support plate 8, and the adhesive that retains the components are all neutral from the electrochemical point of view and are therefore left intact (as mentioned above, the material constituting the bottom face of the active layer 3, i.e. its face in contact with the separating layer 2 is not p-type doped since otherwise the component would itself be attacked from beneath during electrochemical dissolution of the separating layer 2; this material is generally an $n^+$-doped layer).

For further details on the phenomenon of electrochemical dissolution of a semiconductor material, reference may be made in particular to the work by T. Ambridge et al., *The electrochemical characterization of n-type gallium arsenide*, Journal of Applied Electrochemistry, Vol. 3 (1973), p. 1, which describes a method in which such dissolution is used for determining the doping of an n-type GaAs layer. Nevertheless, that constitutes a method seeking to perform electrical characterization of a surface layer of a semiconductor structure, and at no point is it envisaged that that technique could be used to separate a substrate from components made thereon by dissolving a buried separating layer.

It may be observed that, in this phenomenon of anodic dissolution, it is holes that participate in transferring charge and not electrons (on this topic see in particular H. Gerisher, *Physical chemistry-an advanced treatise: IX A electrochemistry*, Chapter 5, published by Eyring, Henderson & Jost, Academic Press, New York (1970)). In other words, if there are no holes, then the semiconductor is not dissolved, which is likewise equivalent to saying that only p-type semiconductors can be dissolved n-type semiconductors can be dissolved only if holes are generated by external action, typically by illumination. That is why provision is made in the anodic dissolution process step of the invention to perform said anodic dissolution in the dark so as to ensure that only p-type semiconductor material is dissolved leaving n-type semiconductor material intact, and in particular the material constituting the bottom region of the active layer.

Figure 6:
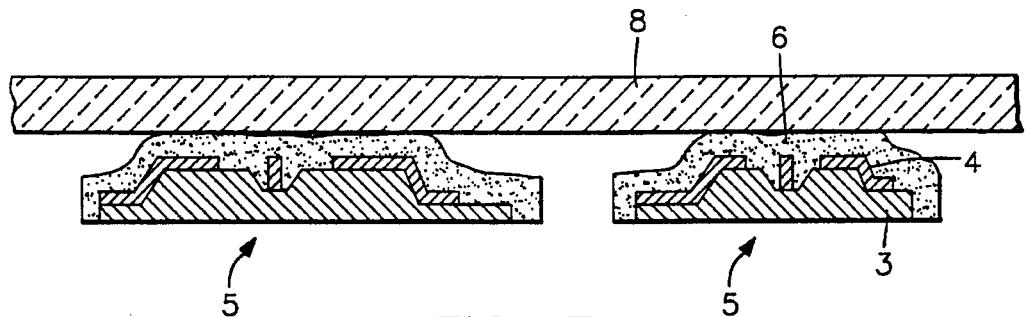

Once the dissolution has been performed, the situation shown in FIG. 6 obtains.

Figure 7:
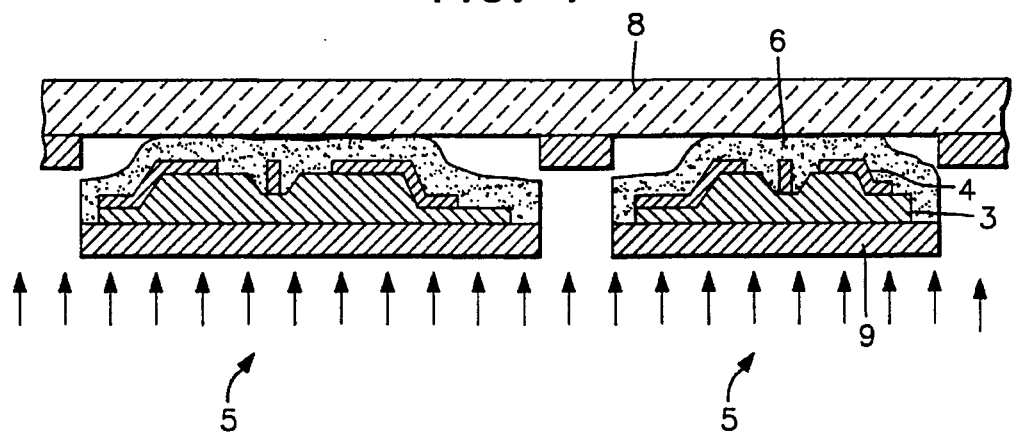

In FIG. 7, the method is continued by depositing metallization 9 on the free face, i.e. the rear face of the doped layer 3. The metallization 9 may be deposited by any conventional method (evaporation, etc.), thereby enabling direct contact to be made with the rear face of the doped layer without interposition of the substrate, and therefore without any need to form vias. In addition, because of this direct contact, the metallization acts effectively as a heat sink.

Operations may then continue in various different ways.

Firstly, it is possible to dissolve the adhesive so as to separate the support plate 8 from individual components 5 or groups of components and thus recover separate chips.

It is also possible, prior to dissolving the adhesive, to fix the assembly on a "drum skin" in conventional manner, thereby making it easier to retain and to separate the various chips after the adhesive has been dissolved.

In addition, in certain applications such as solar cells or light-emitting diodes (LEDs), it may be preferable to leave the plate glued in place so as to have an array of electrically interconnected components (electrical connections being either on the plate itself or else provided in some other way).

It is thus possible to make large-sized light-emitting panels directly, the plate 8 then being a transparent plate of appropriate organic or inorganic material.

Figure 8:
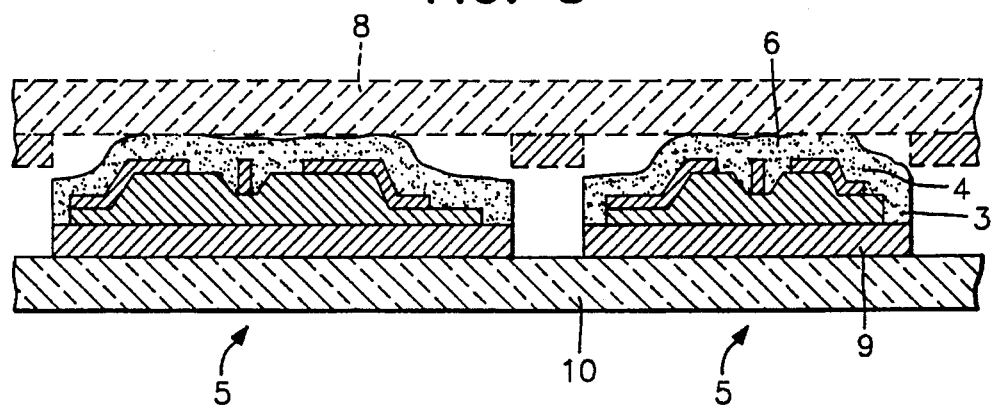

Once the array has been made, it is also possible to stick the components via their bottom faces onto another support plate 10 as shown in FIG. 8, thereby obtaining a "sandwich" structure that is light-emitting or photosensitive as the case may be, and that is constituted by an array of diodes held between two plates 8 and 10 for protection and support purposes.

After being glued to the rear plate 10, it is also possible to release the front plate 8 which then serves merely as a temporary support prior to the components being applied to the final support plate 10. The plate 10 may, in particular, be a metal substrate for reducing the electrical resistance of access to the components, a substrate having high thermal conductivity to enhance heat dissipation, an insulating substrate to reduce parasitic capacitance in an integrated circuit, a reflecting substrate to increase the optical efficiency of a component, etc.

In addition, the support plate may itself comprise an active component.

Figure 9:
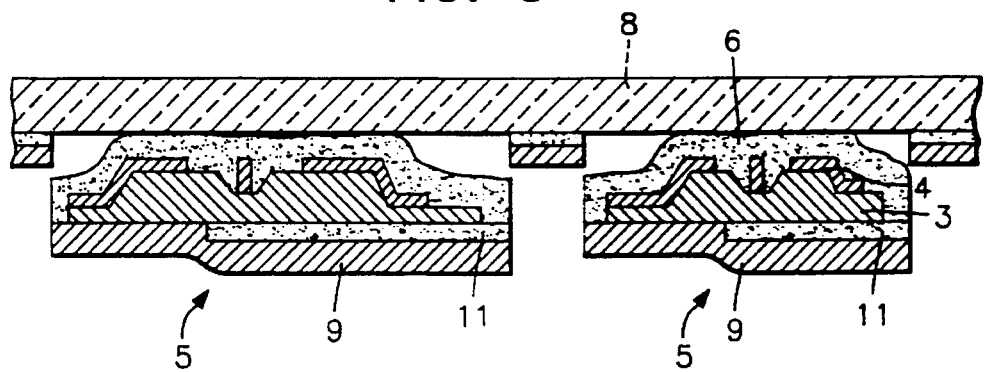

Furthermore, as shown in FIG. 9, provision may be made prior to metallization to deposit an insulating layer 11 overlying the drain electrodes of the transistors in order to reduce parasitic capacitance that could otherwise arise from said electrode being too close to the metallization of the rear face (since the substrate is now absent).

I claim:

1. A method of making semiconductor components, comprising the sequential steps of:
    a) obtaining a substrate;
    b) forming a separating layer of a $p^+$-type doped material on the surface of said substrate;
    c) forming an active layer stack on said separating layer, the active layer stack including a bottom layer with n-type doping;
    d) etching and metalizing said active layer stack to make a set of semiconductor components;
    g) fixing a common support plate on the set of semiconductor components; and
    h) dissolving the separating layer anodically and without illumination, to which frees, without dissolving, the substrate and exposes the rear surface of the active layer stack.

2. The method of claim 1, wherein the active layer stack further includes at least one p-type doped layer, and further comprising, following the etching and metalizing step, the steps of:
    e) covering the set of semiconductor components with a protective layer of a passivation material or of a photosensitive resin; and
    f) etching said protective layer so as to bare the separating layer between said semiconductor components or between groups of said semiconductor components.

3. The method of claim 1, further including, following the dissolving step, the step of:
    i) depositing metallization on the exposed rear surface of the active layer stack.

4. The method of claim 3, further including, following the depositing step, the step of:
    k) separating the semiconductor components or groups of semiconductor components from said common support plate exposing rear faces of the semiconductor components or groups of semiconductor components.

5. The method of claim 4, further including, following the separating step, the step of:
    j) fixing the separated semiconductor components or separated groups of semiconductor components via their exposed rear faces onto a common support member.

6. The method of claim 5, wherein at least one of said common support plate and said common support member carries interconnection lines for the semiconductor components.

7. The method of claim 5, wherein at least one of said common support plate and said common support member is optically transparent, and the semiconductor components are optoelectronic.

\* \* \* \* \*